(12) United States Patent
Terashima

(10) Patent No.: US 12,009,310 B2
(45) Date of Patent: Jun. 11, 2024

(54) SEMICONDUCTOR DEVICE

(71) Applicant: FUJI ELECTRIC CO., LTD., Kawasaki (JP)

(72) Inventor: Kenshi Terashima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 358 days.

(21) Appl. No.: 17/565,067

(22) Filed: Dec. 29, 2021

(65) Prior Publication Data

US 2022/0122920 A1  Apr. 21, 2022

Related U.S. Application Data

(63) Continuation of application No. PCT/JP2020/044019, filed on Nov. 26, 2020.

(30) Foreign Application Priority Data

Jan. 7, 2020  (JP) ................................ 2020-000904

(51) Int. Cl.
*H01L 23/538* (2006.01)
*H01L 23/00* (2006.01)
(Continued)

(52) U.S. Cl.
CPC ........ *H01L 23/5386* (2013.01); *H01L 25/072* (2013.01); *H01L 25/18* (2013.01); *H01L 23/49811* (2013.01); *H01L 24/29* (2013.01); *H01L 24/32* (2013.01); *H01L 24/48* (2013.01); *H01L 24/73* (2013.01); *H01L 2224/29111* (2013.01); *H01L 2224/2912* (2013.01);
(Continued)

(58) Field of Classification Search
None
See application file for complete search history.

(56) References Cited

U.S. PATENT DOCUMENTS

| 2014/0117508 A1* | 5/2014 | Nishi | .................. H01L 23/3735 |
| | | | 257/622 |
| 2015/0130042 A1* | 5/2015 | Sato | .................... H01L 23/3677 |
| | | | 257/690 |

(Continued)

FOREIGN PATENT DOCUMENTS

| JP | 2000031358 A | 1/2000 |
| JP | 2003100983 A | 4/2003 |

(Continued)

OTHER PUBLICATIONS

International Search Report for PCT/JP2020/044019, dated Feb. 16, 2021.
Written Opinion for PCT/JP2020/044019, dated Feb. 16, 2021.

*Primary Examiner* — Michelle Mandala
*Assistant Examiner* — Jordan M Klein
(74) *Attorney, Agent, or Firm* — Rabin & Berdo, P.C.

(57) ABSTRACT

A conductive plate includes a first slit formed in the space between a first chip area and a second chip area, a second slit formed in the space between the first chip area and a terminal area, and a third slit formed in the space between the second chip area and the terminal area. The first slit is a continuous line that penetrates through the conductive plate, whereas the second and third slits are continuous lines that do not penetrate through the conductive plate.

14 Claims, 9 Drawing Sheets

(51) Int. Cl.
*H01L 23/498* (2006.01)
*H01L 25/07* (2006.01)
*H01L 25/18* (2023.01)

(52) U.S. Cl.
CPC ............... *H01L 2224/32157* (2013.01); *H01L 2224/48137* (2013.01); *H01L 2224/48237* (2013.01); *H01L 2224/73265* (2013.01); *H01L 2924/0132* (2013.01); *H01L 2924/014* (2013.01)

(56) References Cited

U.S. PATENT DOCUMENTS

2019/0295915 A1* 9/2019 Tanaka .................... H01L 25/18
2020/0194329 A1 6/2020 Itoh

FOREIGN PATENT DOCUMENTS

| JP | 2011054625 A | 3/2011 |
| JP | 2014216459 A | 11/2014 |
| JP | 2017011028 A | 1/2017 |
| WO | 2019181198 A1 | 9/2019 |

* cited by examiner

SEMICONDUCTOR DEVICE

CROSS-REFERENCE TO RELATED APPLICATION

This application is a continuation application of International Application PCT/JP2020/044019 filed on Nov. 26, 2020 which designated the U.S., which claims priority to Japanese Patent Application No. 2020-000904, filed on Jan. 7, 2020, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power conversion devices. For example, a power device includes semiconductor chips such as insulated gate bipolar transistors (IGBTs) and power metal oxide semiconductor field effect transistors (MOSFETs). This type of semiconductor device includes at least semiconductor chips, wiring terminals, and a ceramic circuit board. The semiconductor chips and wiring terminals are disposed on the ceramic circuit board. The ceramic circuit board includes an insulating plate and a conductive plate provided on the insulating plate. The semiconductor chips and wiring terminals are bonded to the conductive plate using a solder.

When the semiconductor chips and the wiring terminals are bonded to the conductive plate using the solder, the melting solder spreads. When disposed on the melting solder, the semiconductor chips and wiring terminals may be displaced from their desired bonding areas. To prevent this displacement, slits may be formed around the bonding areas in the conductive plate. These slits are able to control the spread of the melting solder in bonding the semiconductor chips and wiring terminals using the solder. In addition, the slits are used for positioning the semiconductor chips and wiring terminals on the conductive plate.

Please see, for example, Japanese Laid-open Patent Publication No. 2003-100983.

It is noted that the slits formed in the conductive plate may change the inductance of a current path in the conductive plate. This change, if occurs, affects the electrical properties of the semiconductor device and thus reduces the reliability of the semiconductor device.

SUMMARY OF THE INVENTION

According to an aspect, there is provided a semiconductor device, including: a substrate including an insulating plate and a conductive plate disposed on a front surface of the insulating plate, the conductive plate having a first chip area, a second chip area and a terminal area in the front surface of the conductive plate; a first semiconductor chip disposed in the first chip area on the front surface of the conductive plate; a second semiconductor chip disposed in the second chip area on the front surface of the conductive plate; and a wiring terminal disposed in the terminal area on the front surface of the conductive plate, wherein the conductive plate includes, on the front surface thereof, a first slit extending in a space between the first chip area and the second chip area, a second slit extending in a space between the first chip area and the terminal area, and a third slit extending in a space between the second chip area and the terminal area, and wherein the first slit is provided as one continuous slit that penetrates completely through the conductive plate in a thickness direction orthogonal to direction of the front surface of the conductive plate and reaches the insulating plate, and one of the second slit and the third slit is provided as either one continuous slit that does not penetrate through the conductive plate in the thickness direction or a plurality of slits forming a broken line pattern, each of the plurality of slits penetrating completely through the conductive plate in the thickness direction and reaching the insulating plate.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, several embodiments will be described with reference to the accompanying drawings. In the following description, the terms "front surface" and "upper surface" represent surfaces facing up in a semiconductor device 50 illustrated in FIG. 1. Similarly, the term "up" represents an upward direction in the semiconductor device 50 of FIG. 1. The terms "rear surface" and "lower surface" represent surfaces facing down in the semiconductor device 50 of FIG. 1. The term "down" represents a downward direction in the semiconductor device 50 of FIG. 1. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" do not always represent the vertical direction to the ground. That is, the "up" and "down" directions are not limited to the gravity direction.

First Embodiment

Figure 1:
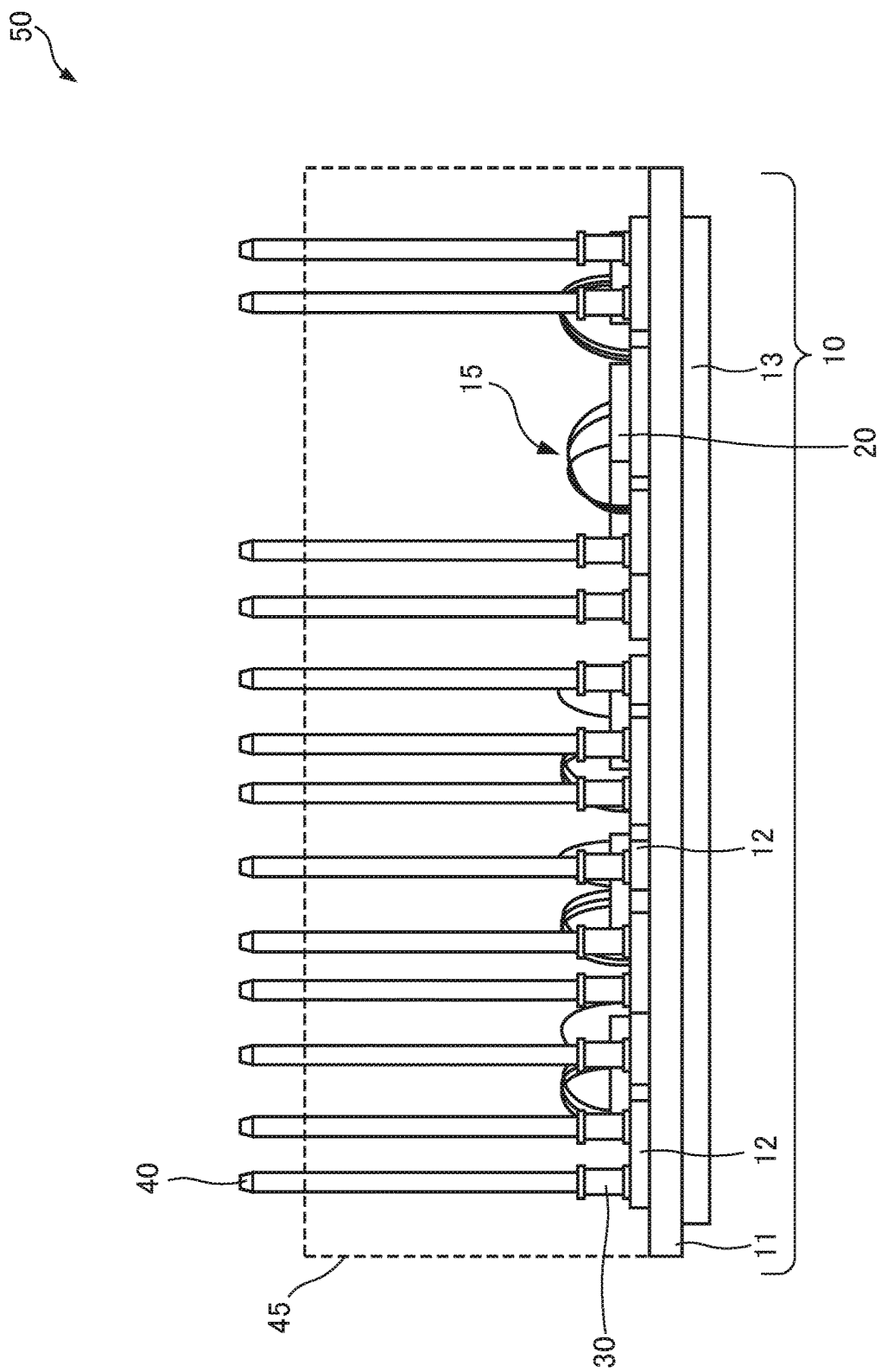
FIG. 1 is a side view of a semiconductor device according to a first embodiment.
Figure 2:
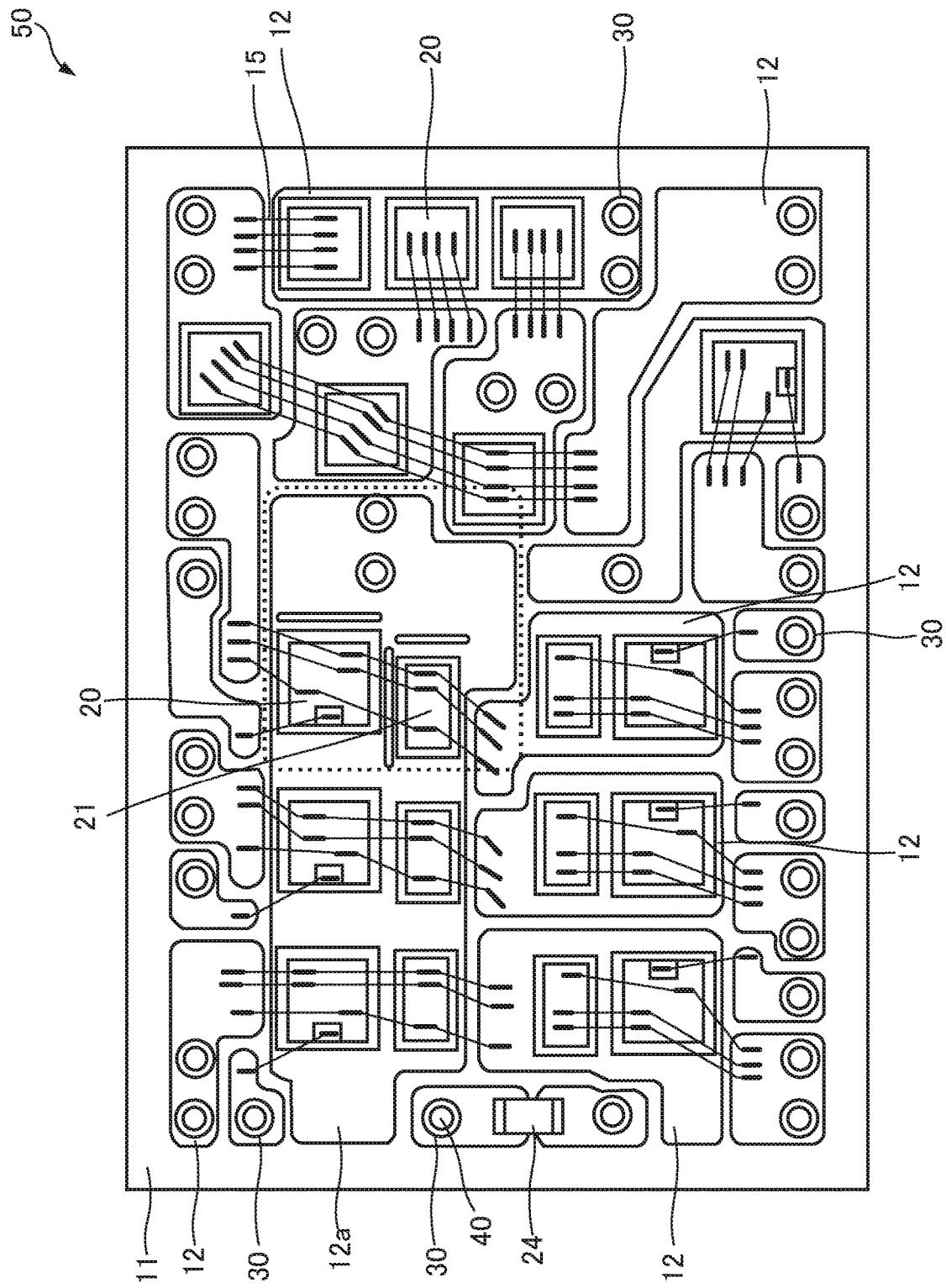
FIG. 2 is a plan view of the semiconductor device according to the first embodiment.

A semiconductor device according to a first embodiment will be described with reference to FIGS. 1 and 2. FIG. 1 is a side view of the semiconductor device according to the first embodiment. FIG. 2 is a plan view of the semiconductor device according to the first embodiment. The broken line in FIG. 1 represents a sealing material 45. The illustration of the sealing material 45 is omitted in FIG. 2. In addition, the case of the semiconductor device 50 is not illustrated. Note that the case encases a ceramic circuit board 10, first and second semiconductor chips 20 and 21, and others. In addition, in the description of the first embodiment, a plurality of conductive plates 12 are given the same reference numeral without being distinguished from each other, and the same applies to the first and second semiconductor chips 20 and 21, a plurality of contact components 30, a plurality of bonding wires 15, and a plurality of external connection pins 40. In this connection, in the case where any other component is provided in plurality, these components will be given the same reference numeral and will be described without being distinguished from each other.

As illustrated in FIGS. 1 and 2, the semiconductor device 50 includes the ceramic circuit board 10 (substrate) and the first and second semiconductor chips 20 and 21 bonded to the front surface of the ceramic circuit board 10. The semiconductor device 50 includes the contact components 30 (wiring terminals) bonded to the front surface of the ceramic circuit board 10. The first and second semiconductor chips 20 and 21 and contact components 30 are bonded to the front surface of the ceramic circuit board 10 using bonding materials (not illustrated). The bonding materials are solders, for example. The solders will be described in detail later. In addition, the semiconductor device 50 includes the bonding wires 15 that electrically connect the front surface of the ceramic circuit board 10 and the main electrodes of the first and second semiconductor chips 20 and 21. An external connection pin 40 is press-fitted into each contact component 30. Furthermore, the semiconductor device 50 is sealed with the sealing material 45 such as to seal the first and second semiconductor chips 20 and 21 on the front surface of the ceramic circuit board 10 and to allow the tips of the external connection pins 40 fitted in the contact components 30 to project from the sealing material 45.

The ceramic circuit board 10 is one example of substrates. This ceramic circuit board 10 is rectangular in a plan view. The ceramic circuit board 10 includes an insulating plate 11, a metal plate 13 disposed on the rear surface of the insulating plate 11, and the plurality of conductive plates 12 (including a conductive plate 12a; the same applies hereafter) disposed on the front surface of the insulating plate 11. The insulating plate 11 and metal plate 13 are rectangular in the plan view, and the corners thereof may be rounded or chamfered. In the plan view, the metal plate 13 is smaller in size than the insulating plate 11 and is located inside the insulating plate 11. The insulating plate 11 is made of ceramics with high thermal conductivity. Examples of the ceramics include aluminum oxide, aluminum nitride, and silicon nitride. The thickness of the insulating plate 11 is in a range of 0.5 mm to 2.0 mm, inclusive. The metal plate 13 is made of metal with high thermal conductivity. Examples of the metal include aluminum, iron, silver, copper, and an alloy containing at least one of these. The thickness of the metal plate 13 is in a range of 0.1 mm to 2.0 mm, inclusive. Plating may be performed on the surface of the metal plate 13 to improve its corrosion resistance. Examples of the plating material used here include nickel, a nickel-phosphorus alloy, and a nickel-boron alloy.

The plurality of conductive plates 12 are made of metal with high electrical conductivity. Examples of the metal include silver, copper, nickel, and an alloy containing at least one of these. The thicknesses of the plurality of conductive plates 12 are in a range of 0.5 mm to 1.5 mm, inclusive. Plating may be performed on the surfaces of the plurality of conductive plates 12 to improve their corrosion resistance. Examples of the plating material used here include nickel, a nickel-phosphorus alloy, and a nickel-boron alloy. The plurality of conductive plates 12 are formed on the insulating plate 11 by forming a metal layer on the front surface of the insulating plate 11 and performing etching or another on the metal layer.

Alternatively, the plurality of conductive plates 12 may be cut out from a metal layer in advance and press-bonded to the front surface of the insulating plate 11. In this connection, the plurality of conductive plates 12 illustrated in FIGS. 1 and 2 are just an example, and the number of conductive plates 12 and the shapes and sizes thereof may be determined as appropriate. In addition, a plurality of slits are formed in the area indicated by the broken line of FIG. 2 in the conductive plate 12a. These slits will be described in detail later.

For the above ceramic circuit board 10, a direct copper bonding (DCB) substrate or an active metal brazed (AMB) substrate may be used, for example. Another example of substrates may be a metal-based substrate. The metal-based substrate includes an insulating layer made of a resin, the metal plate 13 disposed on the rear surface of the insulating layer, and the plurality of conductive plates 12 disposed on the front surface of the insulating layer. In addition, in the semiconductor device 50 sealed with the sealing material 45, the rear surface of the metal plate 13 of the ceramic circuit board 10 is exposed.

The first semiconductor chips 20 are switching elements made of silicon or silicon carbide. The switching elements are each an IGBT or a power MOSFET, for example. In the case where a first semiconductor chip 20 is an IGBT, the first semiconductor chip 20 has a collector electrode serving as a main electrode on its rear surface and also has a gate electrode serving as a control electrode and an emitter electrode serving as a main electrode on its front surface. In the case where a first semiconductor chip 20 is a power MOSFET, the first semiconductor chip 20 has a drain electrode serving as a main electrode on its rear surface and also has a gate electrode serving as a control electrode and a source electrode serving as a main electrode on its front surface. The second semiconductor chips 21 are diode elements made of silicon or silicon carbide. Examples of the diode elements include free wheeling diodes (FWDs), such as Schottky barrier diodes (SBDs) and P-intrinsic-N (PiN) diodes. These second semiconductor chips 21 each have a cathode electrode serving as a main electrode on its rear surface and an anode electrode serving as a main electrode on its front surface. The first and second semiconductor chips 20 and 21 are respectively bonded to predetermined conductive plates 12 using bonding materials (not illustrated), with their rear surfaces facing the conductive plates 12. In this connection, the bonding materials are solders, for example. The bonding materials will be described in detail later. In addition, for example, the thicknesses of the first and second semiconductor chips 20 and 21 are in a range of 180 μm to 220 μm, inclusive, and are approximately 200 μm on average. Note that an electronic component 24 may be disposed on conductive plates 12. The electronic component 24 may be a thermistor or a current sensor, for example.

The bonding wires 15 form electrical connections between the first and second semiconductor chips 20 and 21 and the conductive plates 12 and between the plurality of first and second semiconductor chips 20 and 21 as appropriate. These bonding wires 15 are made of a material with high electrical conductivity. Examples of the material include gold, silver, copper, aluminum, and an alloy containing at least one of these. The diameters of the bonding wires 15 are in a range of 100 μm to 500 μm, inclusive, for example.

The contact components 30 are an example of wiring terminals. Each contact component 30 has a body part and flanges. The body part has a cylindrical through-hole formed therein, and the flanges are provided at the opening ends of the body part. An external connection pin 40 is press-fitted into the through-hole of the body part of each contact component 30. The external connection pin 40 has a rod-shaped body part and tapered tips formed at both ends of the body part. The body part is prism-shaped. The diagonal length of the cross section of the external connection pin 40 is longer by several percent than the diameter of the body part of the contact component 30. The contact components 30 and external connection pins 40 are made of metal with high electrical conductivity. Examples of the metal include silver, copper, nickel, and an alloy containing at least one of these. Plating may be performed on the surfaces of the contact components 30 and external connection pins 40 to improve their corrosion resistance. Examples of the plating material used here include nickel, a nickel-phosphorus alloy, and a nickel-boron alloy.

At least one end of each contact component 30, which is a wiring terminal, needs to be bonded to a conductive plate 12 using a bonding material. Other examples of the wiring terminals are lead frames, bus bars, and external connection terminals. The lead frames electrically connect the first and second semiconductor chips 20 and 21 and the conductive plates 12. The bus bars electrically connect the plurality of conductive plates 12 to one another. The external connection terminals each electrically connects a conductive plate 12 and an external device. The above lead frames, bus bars, and external connection terminals are made of metal with high electrical conductivity. Examples of the metal include silver, copper, nickel, and an alloy containing at least one of these. Plating may be performed on the surfaces of the lead frames, bus bars, and external connection terminals to improve their corrosion resistance. Examples of the plating material used here include nickel, a nickel-phosphorus alloy, and a nickel-boron alloy.

The sealing material 45 contains a thermosetting resin and a filler contained in the thermosetting resin. Examples of the thermosetting resin include an epoxy resin, a phenol resin, and a maleimide resin. Examples of the filler include silicon dioxide, aluminum oxide, boron nitride, and aluminum nitride.

Figure 3:
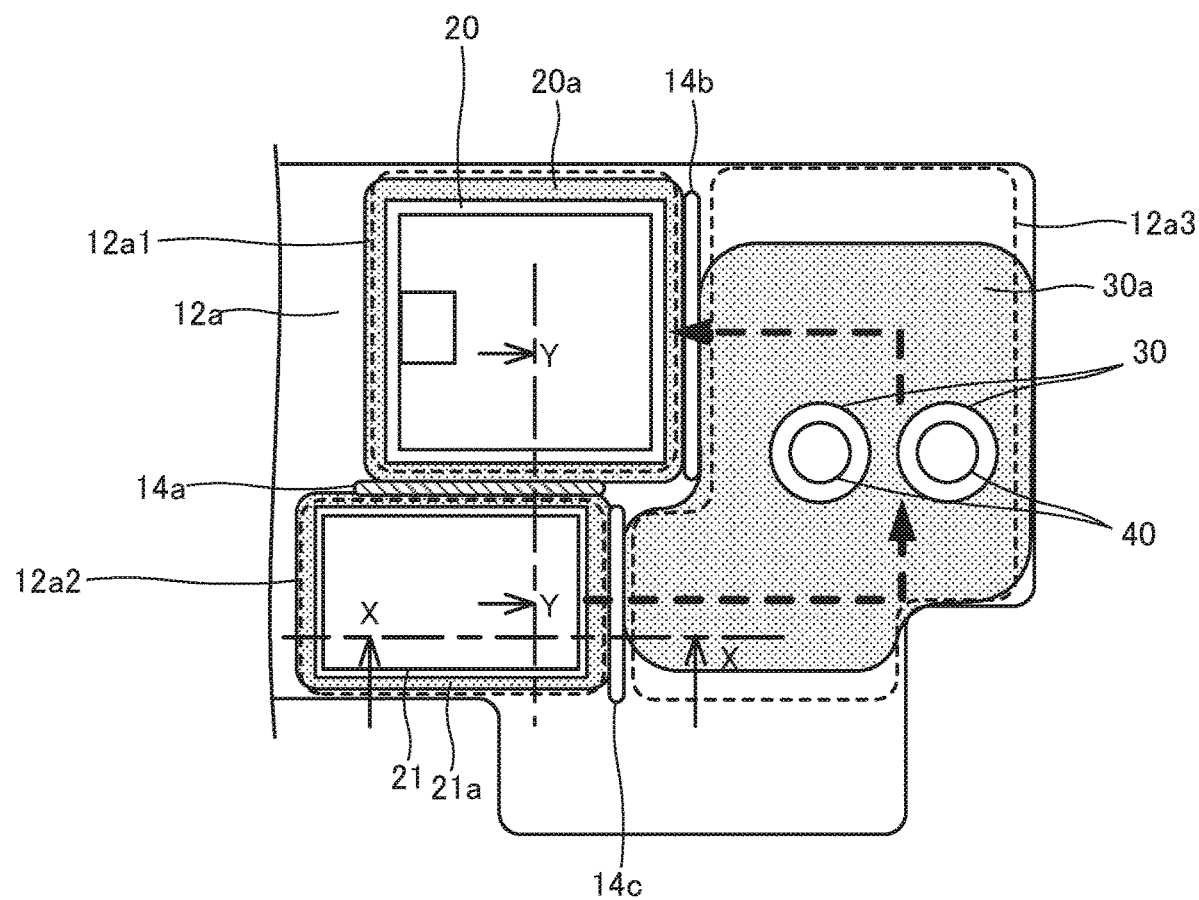
FIG. 3 is a plan view illustrating a main part of a conductive plate of a ceramic circuit board included in the semiconductor device according to the first embodiment.
Figure 4:
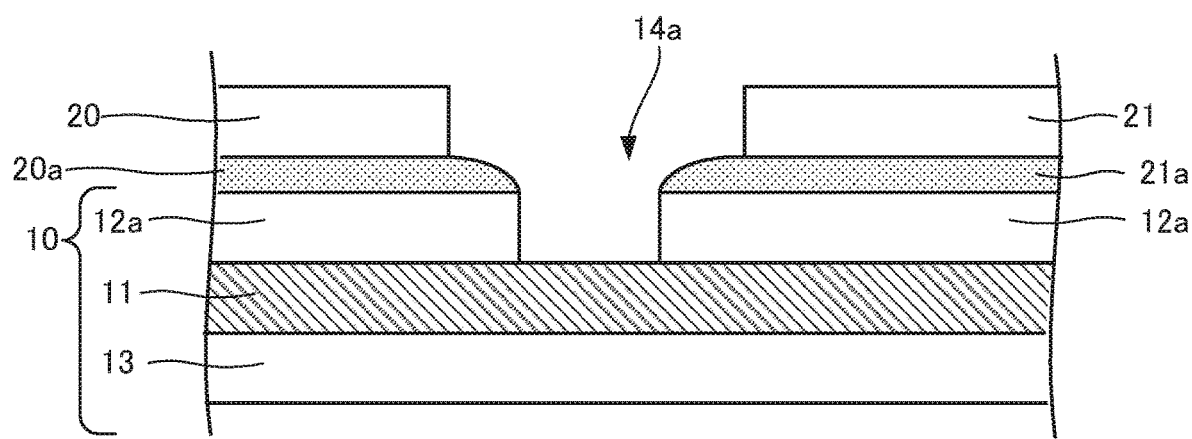
FIG. 4 is a sectional view illustrating a main part of the ceramic circuit board included in the semiconductor device according to the first embodiment (part 1)
Figure 5:
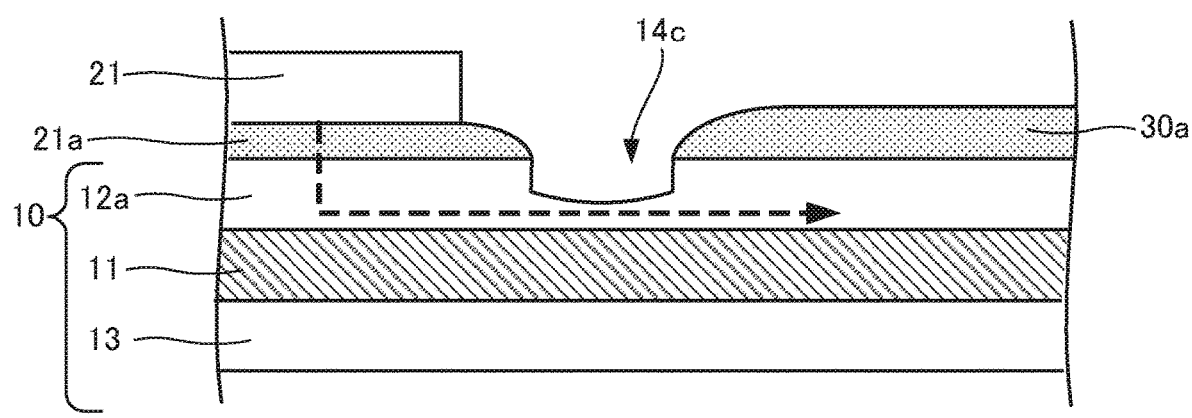
FIG. 5 is a sectional view illustrating a main part of the ceramic circuit board included in the semiconductor device according to the first embodiment (part 2)

The following describes the broken line area of FIG. 2 in the conductive plate 12a of the ceramic circuit board 10 with reference to FIGS. 3 to 5. FIG. 3 is a plan view illustrating a main part of the conductive plate of the ceramic circuit board included in the semiconductor device according to the first embodiment. FIGS. 4 and 5 are sectional views illustrating main parts of the ceramic circuit board included in the semiconductor device according to the first embodiment. In this connection, FIG. 4 is a sectional view taken along the dot-dashed line Y-Y of FIG. 3, and FIG. 5 is a sectional view taken along the dot-dashed line X-X of FIG. 3.

Referring to FIG. 3, a first semiconductor chip 20 is disposed using a solder 20a in a first chip area 12a1 on the front surface of the conductive plate 12a. A second semiconductor chip 21 is disposed using a solder 21a in a second chip area 12a2 on the front surface of the conductive plate 12a. Contact components 30 are disposed using a solder 30a in a terminal area 12a3 on the front surface of the conductive plate 12a. In addition, external connection pins 40 are press-fitted into the contact components 30. The solders 20a, 21a, and 30a are each basically a lead-free solder. For example, the lead-free solder contains one of a tin-silver alloy, a tin-antimony alloy, a tin-zinc alloy, and a tin-copper alloy as a main component. In addition, the solders 20a, 21a, and 30a may contain an additive. Examples of the additive include copper, bismuth, indium, nickel, germanium, cobalt, and silicon. In addition, the solders 20a and 21a for bonding the first and second semiconductor chips 20 and 21 and the solder 30a for bonding the contact components 30 have different solder compositions. The solders 20a and 21a for bonding the first and second semiconductor chips 20 and 21 are unlikely to cause voids, and have high temperature resistance. For example, the solders 20a and 21a contains a tin-antimony alloy as a main component. The solder 30a for bonding wiring terminals such as the contact components 30 have lower elasticity than the solders 20a and 21a. For example, the solder 30a contains a tin-silver alloy as a main component. In this connection, FIG. 3 illustrates a situation in which melting solders 20a, 21a, and 30a spread and solidify. In addition, the solders 20a and 21a for bonding the first and second semiconductor chips 20 and 21 may be thinner than the solder 30a for bonding the contact components 30. The thicknesses of the solders 20a and 21a are in a range of 0.05 mm to 0.25 mm, inclusive. The thickness of the solder 30a is in a range of 0.10 mm to 0.50 mm, inclusive. Since the solder 30a has lower elasticity than the solders 20a and 21a, the solder 30a may be formed thicker than the solders 20a and 21a. The above structure makes it possible to dissipate heat generated by the first and second semiconductor chips 20 and 21 well during the operation of the semiconductor device 50. In addition, the structure makes it possible to prevent occurrence of cracks in the solder 30a and separation of the solder 30a and thus to prevent damage to the semiconductor device 50.

The first chip area 12a1 and the second chip area 12a2 are set adjacent to each other on the conductive plate 12a with their adjacent sides partly facing each other. The terminal area 12a3 is set adjacent to the first and second chip areas 12a1 and 12a2 on the conductive plate 12a such that the terminal area 12a3 faces sides of the first and second chip areas 12a1 and 12a2. In addition, the terminal area 12a3 is set adjacent to the first and second chip areas 12a1 and 12a2 in a direction (horizontal direction of FIG. 3) perpendicular to the arrangement direction (vertical direction of FIG. 3) of the first and second chip areas 12a1 and 12a2 on the conductive plate 12a. The contact components 30 may be disposed anywhere inside the terminal area 12a3, and the positions of the contact components 30 illustrated in FIG. 3 are just an example.

First, second, and third slits 14a, 14b, and 14c are formed in the conductive plate 12a. The first slit 14a is formed in the space between the first chip area 12a1 and the second chip area 12a2. As illustrated in FIGS. 3 and 4, the first slit 14a is a continuous line that penetrates through the conductive plate 12a. The width of the first slit 14a is approximately equal to the thicknesses of the solders 20a and 21a, and may be greater than the thicknesses of the solders 20a and 21a and less than or equal to the width of the space between the first chip area 12a1 and the second chip area 12a2. In this connection, the first and second semiconductor chips 20 and 21 have approximately the same height from the front surface of the conductive plate 12a. In addition, the length of the first slit 14a is preferably longer than at least a length over which the adjacent sides of the first and second chip areas 12a1 and 12a2 face each other. In addition, the length of the first slit 14a is preferably less than or equal to a length corresponding to one of the adjacent sides of the first and second chip areas 12a1 and 12a2. With the above structure, the melting solders 20a and 21a are separated from each other with their edges contacting the respective facing sides of the first slit 14a. Therefore, it is possible to prevent movement of the melting solders 20a and 21a between the first and second chip areas 12a1 and 12a2 and thus to prevent positional shifts of the first and second semiconductor chips 20 and 21 from their predetermined bonding areas.

The second slit 14b is formed in the space between the first chip area 12a1 and the terminal area 12a3. The third slit 14c is formed in the space between the second chip area 12a2 and the terminal area 12a3. As illustrated in FIGS. 3 and 5, the third slit 14c is a continuous line that does not penetrate through the conductive plate 12a. In this connection, as with the third slit 14c illustrated in FIG. 5, the second slit 14b is a continuous line that does not penetrate through the conductive plate 12a, although its cross section is not illustrated. That is to say, the depths of the second and third slits 14b and 14c are less than the thickness of the conductive plate 12a. In addition, the thickness of the solder 30a is greater than that of the solder 21a (and the thickness of the solder 20a). The widths of the second and third slits 14b and 14c may be greater than the thicknesses of the solders 20a and 21a and less than or equal to the width of the space between the first chip area 12a1 and the terminal area 12a3 and the width of the space between the second chip area 12a2 and the terminal area 12a3. The lengths of the second and third slits 14b and 14c are preferably longer than at least a length over which the adjacent sides of the terminal area 12a3 and the first chip area 12a1 face each other and a length over which the adjacent sides of the terminal area 12a3 and the second chip area 12a2 face each other, respectively. In addition, the lengths of the second and third slits 14b and 14c are preferably less than or equal to a length corresponding to the side of the first chip area 12a1 located adjacent to the terminal area 12a3 and a length corresponding to the side of the second chip area 12a2 located adjacent to the terminal area 12a3, respectively. In addition, referring to the FIG. 3, the second and third slits 14b and 14c are formed at sides of the first and second chip areas 12a1 and 12a2, respectively. FIG. 3 illustrates a situation where the second and third slits 14b and 14c have lengths approximately equal to the lengths of the sides of the first and second chip areas 12a1 and 12a2 located adjacent to the terminal area 12a3, respectively. In this connection, the second and third slits 14b and 14c may be formed to have lengths approximately equal to at least the lengths of the sides of the first and second semiconductor chips 20 and 21 located adjacent to the terminal area 12a3, respectively. The second and third slits 14b and 14c may be continuously formed to be a continuous slit. The above first, second, and third slits 14a, 14b, and 14c are formed to have predetermined depths, which depend on their formation positions, by etching or laser processing, for example. By doing so, the melting solders 20a and 30a are prevented from spreading by the corresponding sides of the second slit 14b and are separated from each other. Therefore, it is possible to prevent movement of the melting solders 20a and 30a between the first chip area 12a1 and the terminal area 12a3 and thus to prevent positional shifts of the first semiconductor chip 20 and contact components 30 from their predetermined bonding areas. In addition, since the spread of the solder 20a is prevented, the thickness of the solder under the first semiconductor chip 20 is kept. Thus, it is possible to prevent occurrence of cracks in the solder 20a and poor heat dissipation in the solder 20a.

In addition, as known from the above, the second chip area 12a2 has a first side facing the first chip area 12a1 across the first slit 14a and a second side perpendicular to the first side. The second side faces the terminal area 12a3 across the third slit 14c. In addition, the first chip area 12a1 has a third side facing the second chip area 12a2 and a fourth side perpendicular to the third side. The fourth side faces the terminal area 12a3 across the second slit 14b. In this case, the distance between the first and second semiconductor chips 20 and 21 may be less than the distance between the first semiconductor chip 20 and a contact component 30 and the distance between the second semiconductor chip 21 and the contact component 30. In addition, the width of the first slit 14a may be less than the widths of the second and third slits 14b and 14c.

The above-described semiconductor device 50 includes the ceramic circuit board 10 including the insulating plate 11 and the conductive plate 12a disposed on the front surface of the insulating plate 11, the first semiconductor chip 20 disposed in the first chip area 12a1 on the front surface of the conductive plate 12a, the second semiconductor chip 21 disposed in the second chip area 12a2 on the front surface of the conductive plate 12a, and the contact components 30 disposed in the terminal area 12a3 on the front surface of the conductive plate 12a. The conductive plate 12a has the first slit 14a formed in the space between the first and second chip areas 12a1 and 12a2, the second slit 14b formed in the space between the first chip area 12a1 and the terminal area 12a3, and the third slit 14c formed in the space between the second chip area 12a2 and the terminal area 12a3. The first slit 14a is a continuous line that penetrates through the conductive plate 12a, whereas the second and third slits 14b and 14c are continuous lines that do not penetrate through the conductive plate 12a.

These first, second, and third slits 14a, 14b, and 14c are able to limit the spread of the melting solders 20a, 21a, and 30a. This makes it possible to prevent the different kinds of solders 20a, 21a, and 30a from mixing. In addition, the first slit 14a is a penetrating continuous line that is formed in the conductive plate 12a so as to penetrate through the conductive plate 12a. The first slit 14a is therefore able to prevent positional shifts of the first and second semiconductor chips 20 and 21 and allows them to be disposed close to each other. Further, the second and third slits 14b and 14c are (non-penetrating) continuous lines that are formed in the conductive plate 12a so as not to penetrate through the conductive plate 12a. The second slit 14b therefore allows current from the contact components 30 to flow to the main electrode on the rear surface of the first semiconductor chip 20 along one broken arrow of FIG. 3 reliably. In addition, the third slit 14c allows current output from the rear surface of the second semiconductor chip 21 to flow to the contact components 30 along the other broken line of FIG. 3 and the broken line of FIG. 5 reliably. As described above, the first slit 14a, which is a penetrating continuous line, allows the first and second semiconductor chips 20 and 21 to be disposed close to each other. In addition, the second and third slits 14b and 14c, which are non-penetrating continuous lines, are able to limit the spread of the solders 20a, 21a, and 30a while achieving low-inductance wiring without blocking the current paths between the first and second semiconductor chips 20 and 21 and the contact components 30. As a result, the semiconductor device 50 has improved electrical properties and avoids a reduction in reliability.

Second Embodiment

Figure 6:
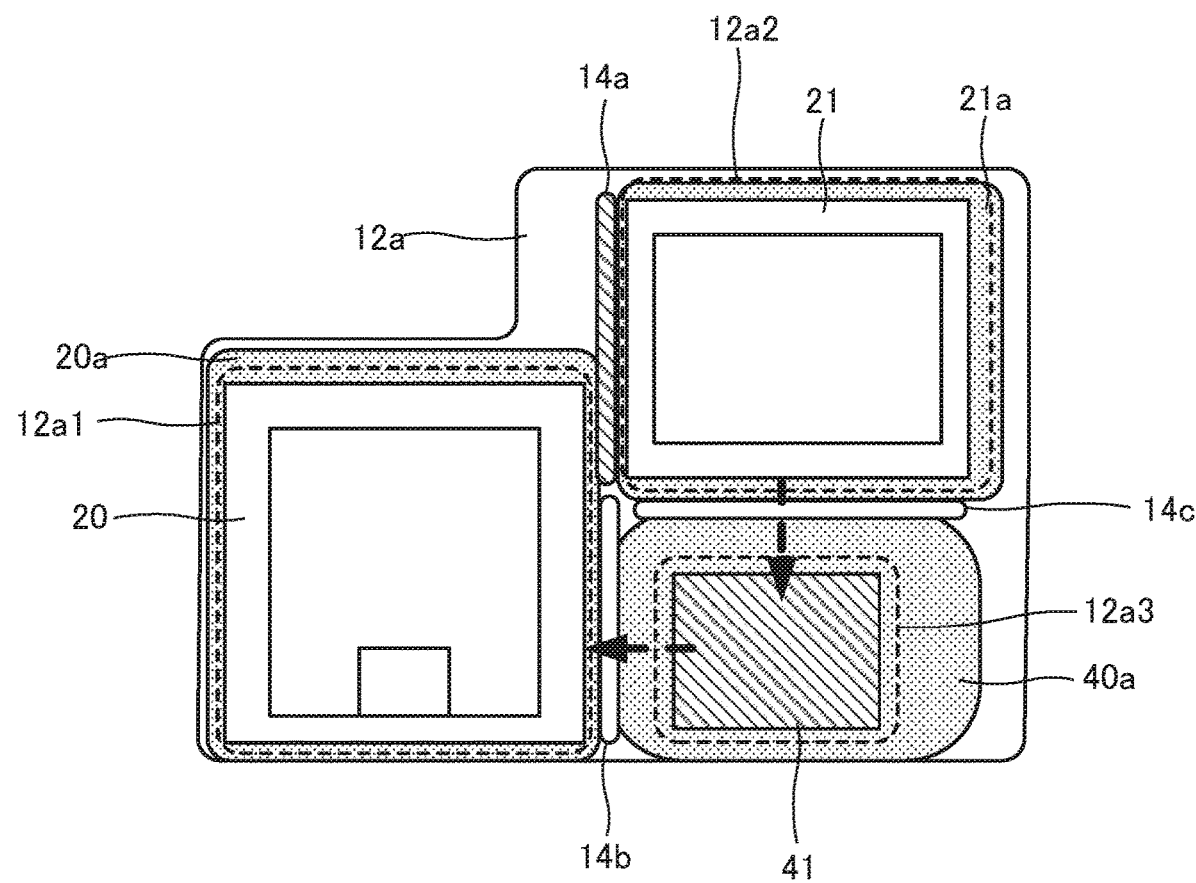
FIG. 6 is a plan view illustrating a main part of a conductive plate of a ceramic circuit board included in a semiconductor device according to a second embodiment.

A second embodiment will now be described with reference to FIG. 6 that illustrates first and second chip areas 12a1 and 12a2 and a terminal area 12a3, the positions and shapes of which are different from those of the first embodiment. FIG. 6 is a plan view illustrating a main part of a conductive plate of a ceramic circuit board included in a semiconductor device according to the second embodiment. The same reference numerals as the constitutional elements of the first embodiment are given to the corresponding constitutional elements of the second embodiment, and their description will be simplified or omitted.

In a conductive plate 12a illustrated in FIG. 6, the first chip area 12a1 is set adjacent to the second chip area 12a2 and is positioned lower than the second chip area 12a2 as seen in FIG. 6. The lower side of the first chip area 12a1 as seen in FIG. 6 is close to the edge of the conductive plate 12a. A first slit 14a is formed in the space between the first chip area 12a1 and the second chip area 12a2. The first slit 14a is formed so as to correspond to the length of the side of the second chip area 12a2 facing the first chip area 12a1. First and second semiconductor chips 20 and 21 are disposed in the first and second chip areas 12a1 and 12a2, respectively. Note that the positions of the first and second chip areas 12a1 and 12a2 in FIG. 6 may be reversed.

The terminal area 12a3 is set on the conductive plate 12a and is surrounded by the side of the first chip area 12a1 shifted in position from the second chip area 12a2 and the lower side of the second chip area 12a2 as seen in FIG. 6. A lead frame 41 that is a wiring terminal is disposed in the terminal area 12a3. The lead frame 41 is bonded to the conductive plate 12a using a solder 40a. In this connection, the solder 40a is made in the same way as the solder 30a of the first embodiment. Second and third slits 14b and 14c are formed along the sides of the first and second chip areas 12a1 and 12a2 (first and second semiconductor chips 20 and 21) facing the terminal area 12a3, respectively. The first slit 14a is a continuous line that penetrates through the conductive plate 12a, whereas the second and third slits 14b and 14c are continuous lines that do not penetrate through the conductive plate 12a.

The second chip area 12a2 has a first side facing the first chip area 12a1 across the first slit 14a and a second side perpendicular to the first side. The second side faces the terminal area 12a3 across the third slit 14c. The first chip area 12a1 has a third side that faces the second chip area 12a2 across the first slit 14a and that faces the terminal area 12a3 across the second slit 14b. In this case, the distance between the first and second semiconductor chips 20 and 21 may be less than the distance between the first semiconductor chip 20 and the lead frame 41 and the distance between the second semiconductor chip 21 and the lead frame 41. In addition, the width of the first slit 14a may be less than the widths of the second and third slits 14b and 14c.

The above-described conductive plate 12a, having the first, second, and third slits 14a, 14b, and 14c formed therein, is able to limit the spread of the melting solders 20a, 21a, and 40a. This makes it possible to prevent the different kinds of solders 20a, 21a, and 40a from mixing. In addition, the first slit 14a is a penetrating continuous line that is formed in the conductive plate 12a so as to penetrate through the conductive plate 12a. The first slit 14a is therefore able to prevent positional shifts of the first and second semiconductor chips 20 and 21 and allows them to be disposed close to each other. In addition, the second and third slits 14b and 14c are (non-penetrating) continuous lines that are formed in the conductive plate 12a so as not to penetrate through the conductive plate 12a. The second slit 14b therefore allows current from the lead frame 41 to flow to the main electrode on the rear surface of the first semiconductor chip 20 along one broken arrow of FIG. 6 reliably. In addition, the third slit 14c allows current output from the rear surface of the second semiconductor chip 21 to flow to the lead frame 41 along the other broken arrow of FIG. 6 reliably. As described above, the first slit 14a, which is a penetrating continuous line, allows the first and second semiconductor chips 20 and 21 to be disposed close to each other. In addition, the second and third slits 14b and 14c, which are non-penetrating continuous lines, are able to limit the spread of the solders 20a, 21a, and 40a while achieving low-inductance wiring without blocking the current paths between the first and second semiconductor chips 20 and 21 and the lead frame 41. As a result, the semiconductor device 50 has improved electrical properties and avoids a reduction in reliability.

Third Embodiment

Figure 7:
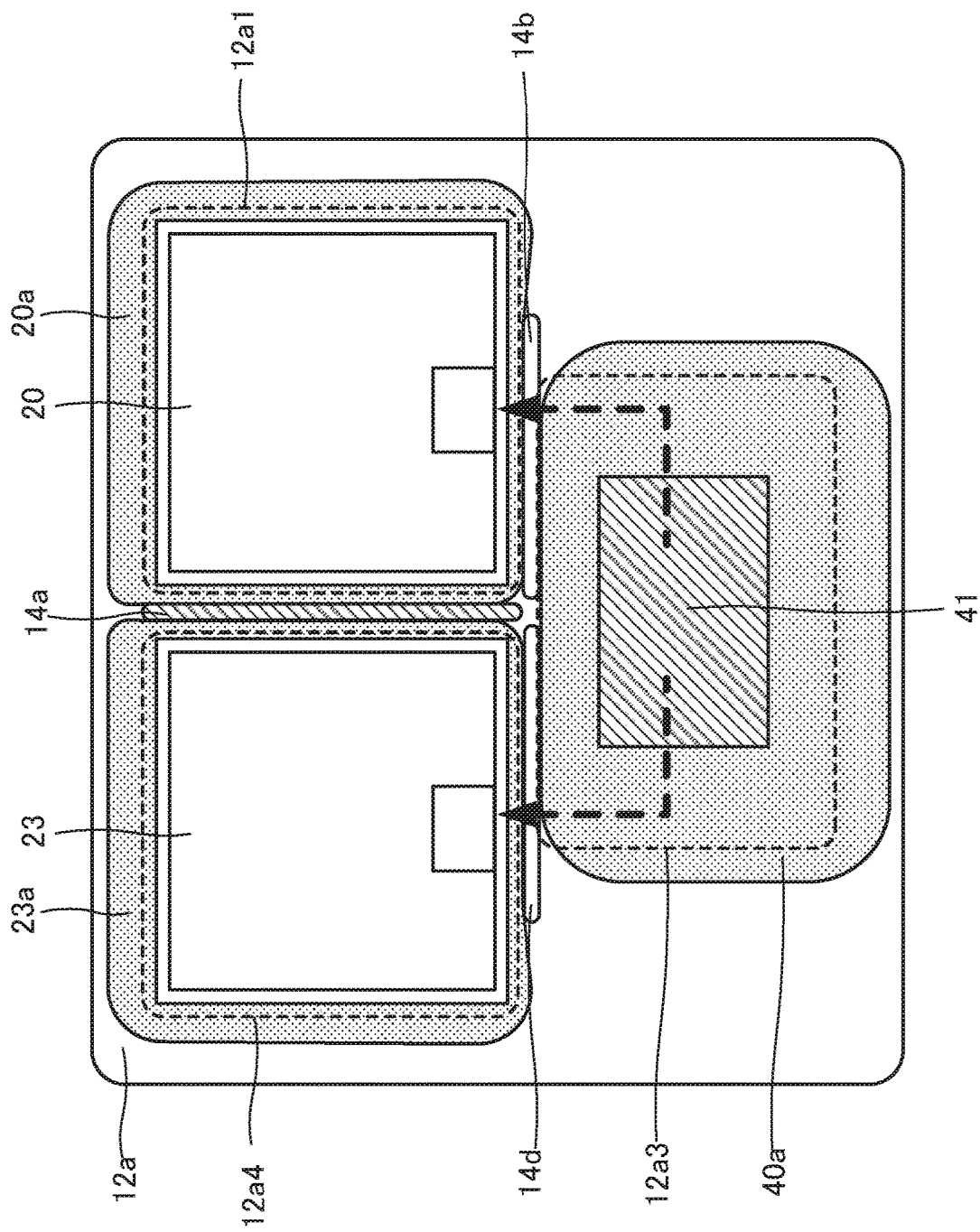
FIG. 7 is a plan view illustrating a main part of a conductive plate of a ceramic circuit board included in a semiconductor device according to a third embodiment.

A third embodiment will now be described with reference to FIG. 7 that illustrates first chip areas 12a1 and 12a4 and terminal area 12a3, the positions and shapes of which are different from those of the first and second embodiments. FIG. 7 is a plan view illustrating a main part of a conductive plate of a ceramic circuit board included in a semiconductor device according to the third embodiment.

In a conductive plate 12a illustrated in FIG. 7, the first chip areas 12a1 and 12a4 are set adjacent to each other with a space therebetween. In this connection, a first semiconductor chip 23 is disposed in the first chip area 12a4 using a solder 23a. The first semiconductor chip 23 is the same switching element as the first semiconductor chip 20. The solder 23a has the same composition as the solder 20a. In addition, a first slit 14a is formed in the space between the first chip areas 12a1 and 12a4. The length of the first slit 14a corresponds to the widths of the first semiconductor chips 20 and 23.

The terminal area 12a3 is set on the conductive plate 12a and faces the lower sides of the first chip areas 12a1 and 12a4 as seen in FIG. 7. A lead frame 41 is bonded in the terminal area 12a3. The lead frame 41 is bonded to the conductive plate 12a using a solder 40a. Second slits 14b and 14d are formed along the sides of the first chip areas 12a1 and 12a4 (first semiconductor chips 20 and 23) facing the terminal area 12a3. In this connection, the second slit 14d is a continuous line that does not penetrate through the conductive plate 12a, as with the second slit 14b. In addition, the second slits 14b and 14d are formed at least in the space sandwiched by the side of the first chip area 12a1 facing the terminal area 12a3 and the terminal area 12a3 and in the space sandwiched by the side of the first chip area 12a4 facing the terminal area 12a3 and the terminal area 12a3, respectively. The first slit 14a is a continuous line that penetrates through the conductive plate 12a, whereas the second slits 14b and 14d are continuous lines that do not penetrate through the conductive plate 12a.

The two first chip areas 12a1 and 12a4 face each other across the first slit 14a. In addition, the two first chip areas 12a1 and 12a4 have sides that are perpendicular to the facing sides of the first chip areas 12a1 and 12a4 and that face the terminal area 12a3 across the second slits 14b and 14d, respectively. The second slits 14b and 14d may be continuously formed. In this case, the distance between the two first semiconductor chips 20 and 23 may be less than the distances between the first semiconductor chips 20 and 23 and the lead frame 41. In addition, the width of the first slit 14a may be less than the widths of the second slits 14b and 14d.

The above-described conductive plate 12a, having the first slit 14a and the second slits 14b and 14d formed therein, is able to limit the spread of the melting solders 20a, 23a, and 40a. This makes it possible to prevent the different kinds of solders 20a, 23a, and 40a from mixing. In addition, the first slit 14a is a penetrating continuous line that is formed in the conductive plate 12a so as to penetrate through the conductive plate 12a. The first slit 14a is therefore able to prevent positional shifts of the first semiconductor chips 20 and 23 and allows them to be disposed close to each other. In addition, the second slits 14b and 14d are (non-penetrating) continuous lines that are formed in the conductive plate 12a so as not to penetrate through the conductive plate 12a. The second slits 14b and 14d therefore allow current from the lead frame 41 to flow to the main electrodes on the rear surfaces of the first semiconductor chips 20 and 23 along the broken arrows of FIG. 7 reliably. As described above, the first slit 14a, which is a penetrating continuous line, allows the first semiconductor chips 20 and 23 to be disposed close to each other. In addition, the second slits 14b and 14d, which are non-penetrating continuous lines, are able to limit the spread of the solders 20a, 23a, and 40a while achieving low-inductance wiring without blocking the current paths between the first semiconductor chips 20 and 23 and the lead frame 41. As a result, the semiconductor device 50 has improved electrical properties and avoids a reduction in reliability.

Fourth Embodiment

Figure 8:
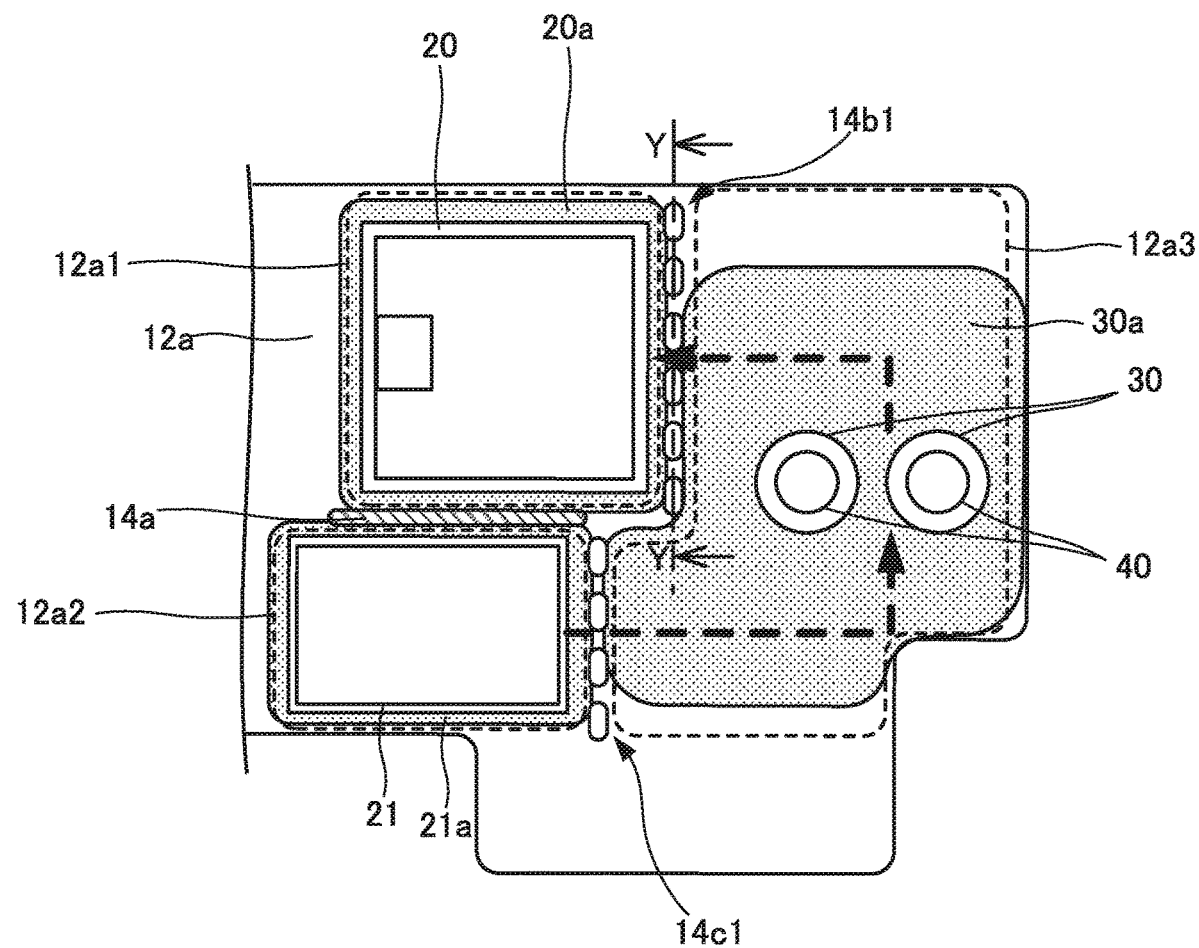
FIG. 8 is a plan view illustrating a main part of a conductive plate of a ceramic circuit board included in a semiconductor device according to a fourth embodiment.
Figure 9:
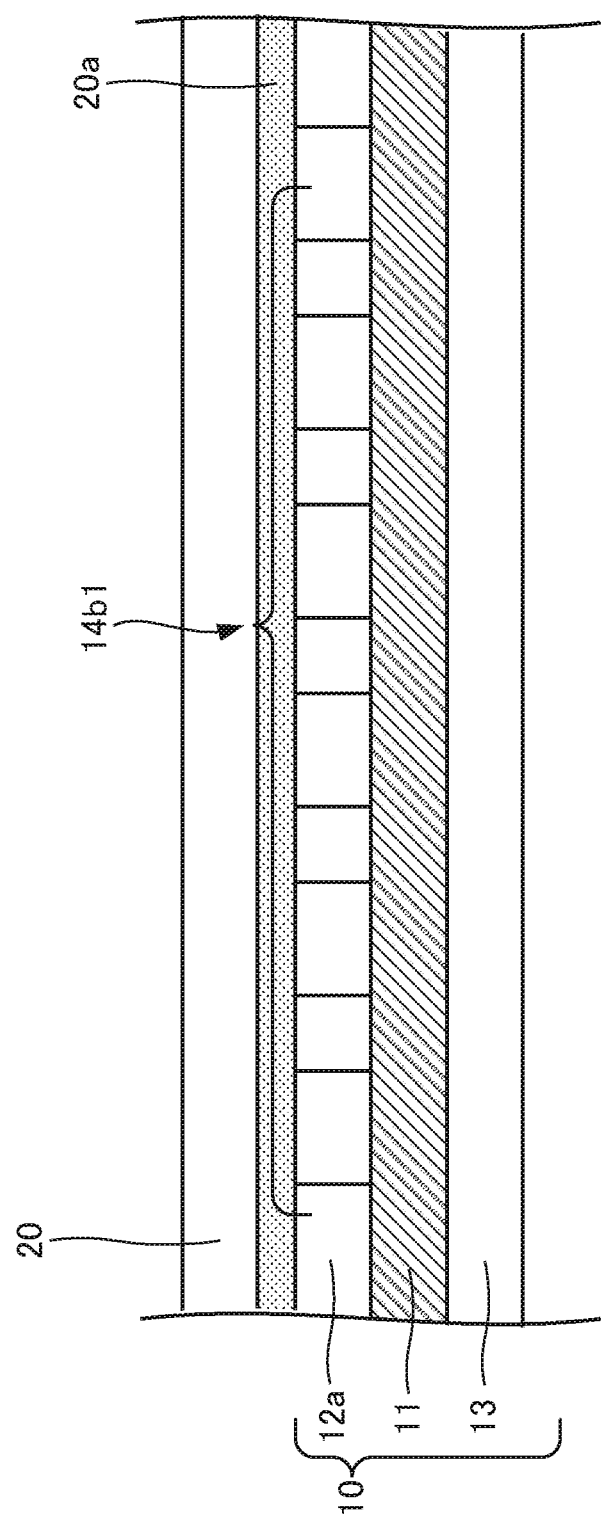
FIG. 9 is a sectional view illustrating the main part of the conductive plate of the ceramic circuit board included in the semiconductor device according to the fourth embodiment.

A fourth embodiment will now be described with reference to FIGS. 8 and 9 that illustrate the case where the second and third slits 14b and 14c of the first embodiment are formed to be broken lines in the conductive plate 12a of the first embodiment. FIG. 8 is a plan view illustrating a main part of a conductive plate of a ceramic circuit board included in a semiconductor device according to the fourth embodiment. FIG. 9 is a sectional view illustrating the main part of the conductive plate of the ceramic circuit board included in the semiconductor device according to the fourth embodiment. FIG. 9 is a sectional view taken along the dot-dashed line Y-Y of FIG. 8.

In a conductive plate 12a illustrated in FIG. 8, second and third slits 14b1 and 14c1 are formed in a broken line shape, in place of the second and third slits 14b1 and 14c1 each formed in a continuous line shape in the conductive plate 12a of FIG. 3. The second slit 14b1 is formed in a broken line shape in the conductive plate 12a so as to intermittently penetrate through the conductive plate 12a in the space between a first chip area 12a1 and a terminal area 12a3. This means that the first chip area 12a1 and the terminal area 12a3 are not divided completely by the second slit 14b1. The second slit 14b1 with the penetrating parts is able to limit the spread of melting solders 20a and 30a. In addition, the second slit 14b1 allows current from contact components 30 to flow to the main electrode on the rear surface of a first semiconductor chip 20 through parts of the second slit 14b1 that do not penetrate through the conductive plate 12a, along one broken arrow of FIG. 8. In addition, as with the second slit 14b1, the third slit 14c1 is formed in a broken line shape in the conductive plate 12a so as to intermittently penetrate through the conductive plate 12a in the space between a second chip area 12a2 and the terminal area 12a3. This means that the second chip area 12a2 and the terminal area 12a3 are not divided completely by the third slit 14c1. The third slit 14c1 with the penetrating parts is also able to limit the spread of the melting solders 21a and 30a. In addition, the third slit 14c1 allows current from the rear surface of the second semiconductor chip 21 to flow to the contact components 30 through parts of the third slit 14c1 that do not penetrate through the conductive plate 12a, along the other broken arrow of FIG. 8.

The above-described conductive plate 12a, having the first, second, and third slits 14a, 14b1, and 14c1 formed therein, is able to limit the spread of the melting solders 20a, 21a, and 30a. This makes it possible to prevent the different kinds of solders 20a, 21a, and 30a from mixing. In addition, the first slit 14a is a penetrating continuous line that is formed in the conductive plate 12a so as to penetrate through the conductive plate 12a. The first slit 14a is therefore able to prevent positional shifts of the first and second semiconductor chips 20 and 21 and allows them to be disposed close to each other. In addition, the second and third slits 14b1 and 14c1 are intermittently-penetrating broken lines that are formed in the conductive plate 12a so as to intermittently penetrate through the conductive plate 12a. The second slit 14b1 therefore allows current from the contact components 30 to flow to the main electrode on the rear surface of the first semiconductor chip 20 along the broken arrow of FIG. 8 reliably. In addition, the third slit 14c1 allows current output from the rear surface of the second semiconductor chip 21 to flow to the contact components 30 along the broken arrow of FIG. 8 reliably. As described above, the first slit 14a, which is a penetrating continuous line, allows the first and second semiconductor chips 20 and 21 to be disposed close to each other. The second and third slits 14b1 and 14c1, which are intermittently-penetrating continuous lines, are able to limit the spread of the solders 20a, 21a, and 30a while achieving low-inductance wiring without blocking the current paths between the first and second semiconductor chips 20 and 21 and the contact component 30. As a result, the semiconductor device 50 has improved electrical properties and avoids a reduction in reliability.

With the disclosed techniques, a semiconductor device is provided, which has a structure that is able to control spread of a melting solder and to prevent changes in inductance and thus which avoids a reduction in reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a substrate including an insulating plate and a conductive plate disposed on a front surface of the insulating plate, the conductive plate having a first chip area, a second chip area and a terminal area in the front surface of the conductive plate;
a first semiconductor chip disposed in the first chip area on the front surface of the conductive plate;
a second semiconductor chip disposed in the second chip area on the front surface of the conductive plate; and
a wiring terminal disposed in the terminal area on the front surface of the conductive plate,
wherein the conductive plate includes, on the front surface thereof, a first slit extending in a space between the first chip area and the second chip area, a second slit extending in a space between the first chip area and the terminal area, and a third slit extending in a space between the second chip area and the terminal area, and
wherein the first slit is provided as one continuous slit that penetrates completely through the conductive plate in a thickness direction orthogonal to direction of the front surface of the conductive plate and reaches the insulating plate, and one of the second slit and the third slit is provided as either one continuous slit that does not penetrate through the conductive plate in the thickness direction or a plurality of slits forming a broken line pattern, each of the plurality of slits penetrating completely through the conductive plate in the thickness direction and reaching the insulating plate.

2. The semiconductor device according to claim 1, wherein both the second and third slits are each provided as the one continuous slit that does not penetrate through the conductive plate in the thickness direction so that depths of the second and third slits are less than a thickness of the conductive plate.

3. The semiconductor device according to claim 1, wherein the second slit is provided along a side of the first semiconductor chip facing the terminal area in the conductive plate.

4. The semiconductor device according to claim 3, wherein a length of the second slit in a direction in which the second slit extends is approximately equal to a length of the side of the first semiconductor chip facing the terminal area.

5. The semiconductor device according to claim 1, wherein the third slit is provided along a side of the second semiconductor chip facing the terminal area in the conductive plate.

6. The semiconductor device according to claim 5, wherein a length of the third slit in a direction in which the third slit extends is approximately equal to a length of the side of the second semiconductor chip facing the terminal area.

7. The semiconductor device according to claim 1, wherein the second chip area includes a first side facing the first chip area across the first slit, and a second side perpendicular to the first side and facing the terminal area across the third slit.

8. The semiconductor device according to claim 7, wherein the first chip area includes a third side that includes a first-third side and a second-third side, the first-third side facing the second chip area across the first slit, the second-third side facing the terminal area across the second slit.

9. The semiconductor device according to claim 7, wherein the first chip area includes a third side facing the second chip area, and a fourth side perpendicular to the third side and facing the terminal area across the second slit.

10. The semiconductor device according to claim 1, wherein
the first semiconductor chip and the second semiconductor chip are bonded to the conductive plate using a first bonding material, and
the wiring terminal is bonded to the conductive plate using a second bonding material different from the first bonding material.

11. The semiconductor device according to claim 10, wherein
the first bonding material is a solder that contains a tin-antimony alloy as a main component, and
the second bonding material is a solder that contains a tin-silver alloy as a main component.

12. The semiconductor device according to claim 10, wherein a width of the first slit in a direction orthogonal to a direction in which the first slit extends is approximately equal to a thickness of the first bonding material in the thickness direction.

13. The semiconductor device according to claim 1, wherein
the first semiconductor chip and the second semiconductor chip are bonded to the conductive plate using a first bonding material,
the wiring terminal is bonded to the conductive plate using a second bonding material, and
a thickness of the first bonding material is less than a thickness of the second bonding material in the thickness direction.

14. The semiconductor device according to claim 1, wherein
the first semiconductor chip is a switching element, and
the second semiconductor chip is a diode element.

* * * * *